(12) United States Patent
Zoodsma

(10) Patent No.: US 7,343,963 B2
(45) Date of Patent: Mar. 18, 2008

(54) HYBRID HEAT SINK PERFORMANCE ENHANCEMENT USING RECIRCULATING FLUID

(75) Inventor: Randy J. Zoodsma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 11/296,557

(22) Filed: Dec. 7, 2005

(65) Prior Publication Data

US 2007/0125519 A1 Jun. 7, 2007

(51) Int. Cl.
*F28D 15/00* (2006.01)

(52) U.S. Cl. ............................... 165/104.33; 165/80.3; 165/80.4

(58) Field of Classification Search ........... 165/104.33, 165/104.19, 80.3–80.5, 108
See application file for complete search history.

(56) References Cited

U.S. PATENT DOCUMENTS

| | | | |
|---|---|---|---|
| 3,253,646 A * | 5/1966 | Koltuniak et al. ......... | 165/80.4 |
| 4,549,603 A * | 10/1985 | Shirai et al. ........... | 165/104.33 |
| 6,019,165 A * | 2/2000 | Batchelder ................. | 165/80.3 |
| 6,600,649 B1 * | 7/2003 | Tsai et al. .............. | 165/104.33 |
| 6,702,002 B2 * | 3/2004 | Wang ........................ | 165/80.3 |
| 6,711,016 B2 | 3/2004 | Chung et al. ............... | 361/695 |
| 6,729,383 B1 * | 5/2004 | Cannell et al. ............ | 165/80.3 |
| 6,798,663 B1 * | 9/2004 | Rubenstein ................. | 361/710 |
| 6,807,056 B2 * | 10/2004 | Kondo et al. .............. | 165/80.4 |
| 7,167,364 B2 * | 1/2007 | Lopatinsky et al. ....... | 165/80.4 |
| 2002/0029873 A1 * | 3/2002 | Sugito et al. ............... | 165/166 |
| 2001/0101718 | 8/2002 | Negishi et al. ............ | 361/699 |
| 2004/0066625 A1 | 4/2004 | Meyer et al. ............... | 361/699 |

* cited by examiner

*Primary Examiner*—Teresa J. Walberg
(74) *Attorney, Agent, or Firm*—Lily Neff

(57) ABSTRACT

A method and incorporated heat sink that is cooled both thorough air flow and liquid circulation is provided. The heat sink is disposed close to electronic components and used for their cooling. It comprises a finned structure positioned such that air can easily pass though it; a heat source plate disposed thermally in direction of heat flow to one side of the finned structure such that the heat source plate is in thermal communication with the finned structure fin base and fin tips, and a second plate also disposed at an opposing end of the finned structure in thermal communication both with finned structure fin base and fin tips. The heat sink also includes fluid re-circulator disposed at least partially in the plates for circulating fluids though the plates and around said finned structure such that both fin tips and fin base is cooled.

17 Claims, 4 Drawing Sheets

HYBRID HEAT SINK PERFORMANCE ENHANCEMENT USING RECIRCULATING FLUID

CROSS-REFERENCE TO RELATED APPLICATIONS

This application contains subject matter which is related to the subject matter of the following co-pending application, which is also assigned to the same assignee as this application, International Business Machines Corporation of Armonk, N.Y. and is by the same inventor. The application listed below, filed on the same day, is hereby incorporated herein by reference in its entirety: "Hybrid Heat Sink With Recirculating Fluid And Interleaving Fins" application Ser. No. 11/296,556 by R. J. Zoodsma and filed on the same day as this application and owned by the same assignee.

BACKGROUND OF THE INVENTION

1. Field of the Invention

This invention relates to cooling of electronic packages used in computing system environments and more particularly to cooling of electronic components used in a server or other such large computers.

2. Description of Background

The recent industry trend of continuously increasing the number of electronic components inside computing system environments has led to many challenges for the designers of these systems. One such continuous challenge lies with the issue of heat dissipation. In smaller computing system environments, such as those that include one or several personal computers, the number of heat generating components are limited. In larger environments, however, such as those that include one or more computer networks in processing communication with one another, finding a solution for heat dissipation issues is more challenging.

Heat dissipation if unresolved, can result in electronic and mechanical failures that will affect overall system performance, no matter what the size of the environment. As can be easily understood, however, heat dissipation increases as the packaging density increases. Therefore, in larger computing system environments, the problem of heat dissipation becomes even more of a concern for the designers of these systems. In addition, in larger environments, thermal management solutions must be provided that take other needs of the system environment as a whole into consideration. In larger environments, improper heat dissipation can create a variety of other seemingly unrelated problems ranging from dynamic loading problems affecting structural rigidity of the computing system environment, to cost prohibitive solutions to provide proper air conditioning to customer sites where such computing system environments are being stored.

The prior art currently being practiced incorporate finned heat sinks in their designs in order to cool electronic components. As the number of electronic components have increased, designers of such systems have used a number of techniques to improve the capability of such finned heat sinks to improve thermal management.

In recent years, efforts have been made to change the fin material, fin thickness, fin height and fin pitch, among others, in order to improve the cooling capabilities of prior art heat sinks. Unfortunately, while most these efforts have been helpful in improving the transfer of heat up the fins, they have not been very effective in increasing the thermal capabilities. As an example, when the fin height was doubled, only a relatively small improvement was achieved. Furthermore, in this scenario, the tips of the fins ended up remaining significantly cooler than the fin base, indicating improper handling of heat dissipation.

In other approaches, attempts have been made to put a spreader plate on the top and bottom of the fins and then connect the plates to one another using pipes, particularly heat pipes. In this approach, the intent was to adjust the temperature of the fin base and tip so as to keep them at relatively similar temperatures. Unfortunately, heat limitations of heat pipes used in this approach alongside temperature drops associated with contact resistance of the heat pipes have limited the success associated with this approach.

Related application POU920050168US1 that is incorporated herein, provides for a new and improved cooling arrangement that can incorporate hybrid heat sinks that cool electronic components by the use of both fluids and air in order to meet the current thermal management growing needs, particularly by providing an on-chip solution that cools electronic components immediately and where thermal management is most needed. That application uses convection to provide thermal management of the structure including fin tips and fin base. The present application, by contrast, introduces for a new and improved cooling arrangement using an air and liquid cooled hybrid heat sink designed to meet the current thermal management growing needs using conduction methodology.

SUMMARY OF THE INVENTION

The shortcomings of the prior art are overcome and additional advantages are provided through the provision of a method and incorporated hybrid heat sink that utilizes recirculating fluid(s) to provide an enhanced thermal management solution.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
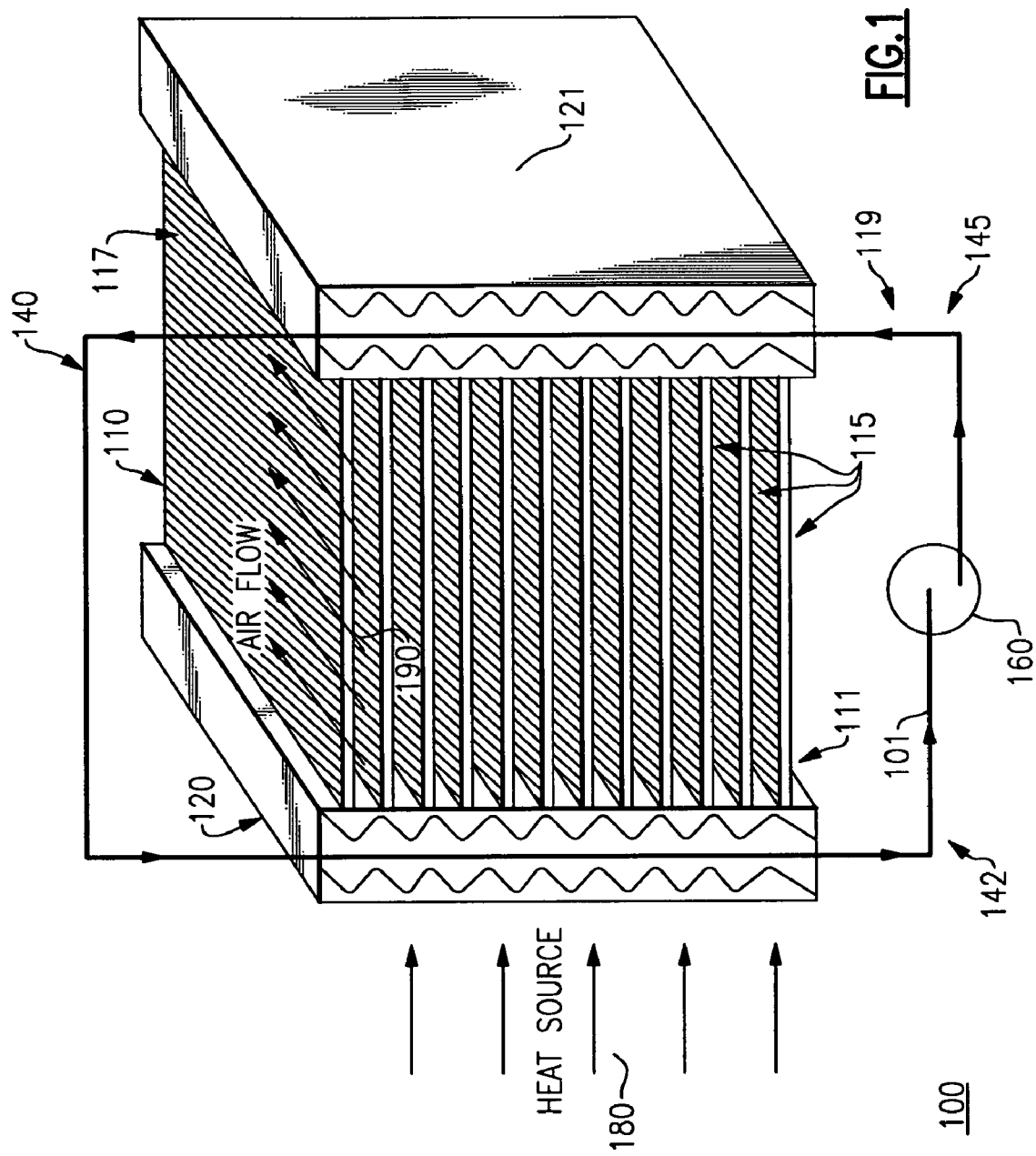
FIG. 1 is a cross sectional illustration of an overall view of one embodiment of the present invention.

FIG. 1 is cross sectional illustration of a heat sink assembly as per one embodiment of the present invention. In this embodiment, a heat sink with a plurality of fins is provided but other arrangements can equally apply to the workings of the present invention. Consequently, the workings of the present invention shall not be only limited to the heat sink arrangements and/or other restrictions as provided by the figures as these are only provided as examples to help with ease of understanding.

As stated, FIG. 1 is an illustration of one embodiment of the present invention depicting a heat sink 100. The heat sink 100 comprises of a finned structure 110 with one or a plurality of fins 115, only some of which are referenced for easy of visibility as 115. The heat sink also comprises of a heat source plate 120 disposed one side of the finned structure 110 and another plate 122 which is disposed on an opposing side from the heat source plate 120, such that the finned structure is disposed between the two plates 120 and 122. In one embodiment, the fins 115 are embedded into either or both plates 120 and 122 and the finned structure 110 is secured at both sides to the plates 120 and 122 using means known to those skilled in the art.

The plates 120 and 122 are comprised of a thermally conductive material. In a preferred embodiment of the invention, the plates 120 and 122 are formed out of metal or metal compounds out of same or different materials. Similarly the finned structure 110 comprising individual fins 115 is also fabricated of a thermally conductive material such as metal and metal compounds that is similar or dissimilar to the material of the plates 120 and/or 122.

The heat sink 100, including the finned structure 110 and the spreader plate 120, is cooled by a liquid re-circulator 140 as illustrated in the figure. In the embodiment provided in FIG. 1, fluid re-circulator 140 further comprises of a circulator unit 142 and a fluid carrier 145 but other arrangements and/or components may be selectively used for the liquid re-circulator 140. The circulator unit 142, in a preferred embodiment, comprises a pump 160. It is also possible to provide more than one circulator unit 142, that are either housed together or separately according to cooling needs.

It should be noted, that the fluid carrier 145 and the circulator unit when connected form a closed loop. Other arrangements can also be possible where a fluid supply or valves or other components or this nature are provided additionally. In any such arrangements, however, the end result should still yield a substantially closed fluid loop.

As illustrated the fluid carrier is at least partially embedded in the plates 120 and 122. In one embodiment of the present invention, the fluid carrier comprises of piping that is preferably also formed of thermally conductive materials such as metals and metal compounds.

Coolant can be supplied in the loop prior to closing of the loop or on a continuous basis through the use of valves or other means that help maintain a substantially closed environment. Liquid coolants in FIG. 1 are pre-supplied and referenced as 119. A variety of liquid coolants, including water, can be used as known to those skilled in the art.

In FIG. 1, the direction of the heat source 180 and air flow 190 are also depicted. The direction of the heat source, as provided by the arrows, is representative of the placement of the heat sink 100 in relation to the electronic heat producing components present on an electronics board, which are not illustrated in the depiction of FIG. 1. In a preferred embodiment, as shown in FIG. 1, the heat source plate 120 is disposed such that it is closest to the direction of heat flow.

The fin structure 110 is oriented such that the direction of air flow 190 can also be utilized in further cooling of the fins, therefore creating almost a hybrid air and liquid cooling assembly. The direction of the air flow 190, as depicted is such that it can pass over and through the fin structure 110, such as through the individual fins 115 and above and below them, such that air flow itself can cool the fins individually.

Referring back to FIG. 1, for ease of understanding it is assumed that the coolant is water and the closed liquid loop comprises of piping and a liquid re-circulating pump for circulating water inside the loop.

The invention then uses re-circulating liquid to provide flow through the finned structure with spreader plates transferring cooler temperatures to both the fin base 111 and fin tips 116. The liquid coolant 119 is placed in thermal communication with the finned structure 110 and the spreader plate 120 such that base of said finned structure and said fin tips 117 are in thermal communication with the spreader plate 120 and the recirculating liquid coolant 119 by being recirculated through the re-circulator 140 is ultimately placed in thermal communication with the spreader plate 120 and the finned structure 110 such that recirculating coolants 119 can flow through the re-circulator 140 to cool the finned structure 110 with said spreader plates 120 also cooling both fin bases 111 and fin tips 117 through heat convection and liquid flow. In other words, the re-circulating liquid causes a portion of the heat in the base 111 to be convectively carried to liquid cooling spreader plate 120 attached to the tips of the fins 117.

In other words, heat from the electronic components (not illustrated) flows in the direction of arrows referenced as 180 toward the heat source plate 120. Some of the heat is then absorbed and convected into the water by being thermally transmitted through the thermally conductive material forming the heat plate 120. Heated water, then recirculates through both plates 120 and 122 by the use of recirculating pump 160. Since the fins are also formed out of thermally conductive material, heated water disperses the heat such that fin tips no longer end up remaining at a temperature that is significantly cooler than the fin base. This redistribution of heat, consequently allowing the heat sink 100 to utilize fin structure 110 in a more efficient manner.

There may be a small portion of the heat that is not fully convected into the water. However, this additional remaining heat will be transferred to the fins. Since the heat sink 100 is being cooled both by the use of liquid and air, the remaining heat will be uniformly air cooled once it is transferred to the finned structure simply though the flow of air referenced by arrows 190.

FIG. 1 is only one embodiment of the present invention. Many other embodiment are possible where a plurality of closed fluid loops or a plurality of recirculating pumps are provided. One such alternate embodiment is provided in FIG. 2.

Figure 2:
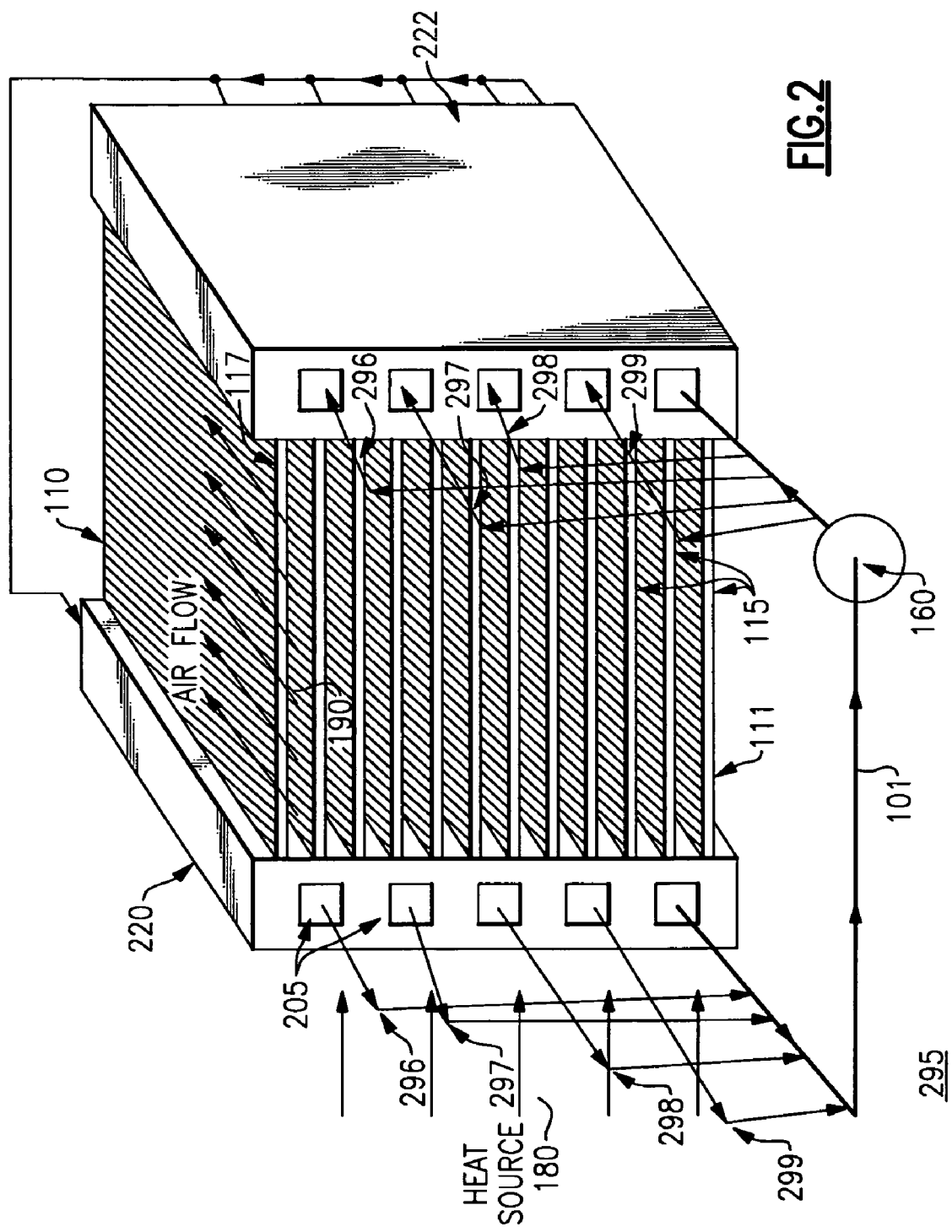
FIG. 2 is a cross sectional illustration of the embodiment provided in FIG. 1 showing further details of recirculating fluid(s)

FIG. 2 is a cross sectional depiction of an alternate embodiment of the present invention. As was the case in the embodiment of FIG. 1, a heat sink 200 having a finned structure 110 with individual fins 115 is provided. Disposed at each end of the finned structure 110 are a heat source plate 220 and an opposing cold plate 222, in this embodiment top plate 222. As before, in a preferred embodiment, the finned structure is embedded in the plates 220 and 222.

The plates 220 and 222 are thermally conductive and are preferably fabricated out of metal or metal compounds. Plates 220 and 222, however, are given different reference numbers however as they are formed structurally different than what was provided in the embodiment of FIG. 1.

In FIG. 2, to enhance thermal conductivity of the plates 220 and 222, the plates no longer are comprised of solid metal structures. The new structure of the plates 220 and 222 is comprised out of a structure that includes a plurality of apertures 205.

The apertures 205 are provided so that a plurality of recirculating fluid loops can traverse through the apertures as illustrated by loops 295, 296, 297, 298 and 299. Each of these loops comprise thermally conductive fluid carriers that is collectively referenced as 245. It is possible, however, that each such loop is fabricated of different materials or that they are fabricated having different structures. The fluid carriers are preferably fabricated of metal or metal compounds.

In addition, in a preferred embodiment, such as the one illustrated in FIG. 2, the fluid carriers 245 are comprised of piping. It should be noted that while the loops referenced as 295 though 299, in this embodiment, are all depicted to be positioned on parallel planes, due to the aperatures provided and the structure of the plates 220 and 222, additional embodiments can be provided where the loops are not in positioned in perfectly parallel planes.

In addition, the piping loops whether in the same plane or oriented in intersecting planes can be all connected to one circulating unit 160 or to a plurality of such units. Consequently, it is possible to selectively provide each closed liquid loop 295 through 299 with an exclusive coolant unit or provide an arrangement where two or more such closed loops share the same circulating unit. In such a case, the number of cooling units also depends on whether the loops that are positioned on intersecting planes are internally connecting such that they provide a single liquid circulating unit. The alternative being a structure where each independent closed piping loops positioned in intersecting planes being disposed on top of one another as depicted in FIG. 2. In addition, the circulator units can also be housed together or separately, as selectively desired to maximize cooling needs and storage management.

It should also be noted that a variety of liquid coolants, as known to those skilled, in the art can be used to flow in the different fluid carriers when more than one fluid carrier is provided. In a preferred embodiment, however, water is used as the primary coolant fluid.

Figure 3:
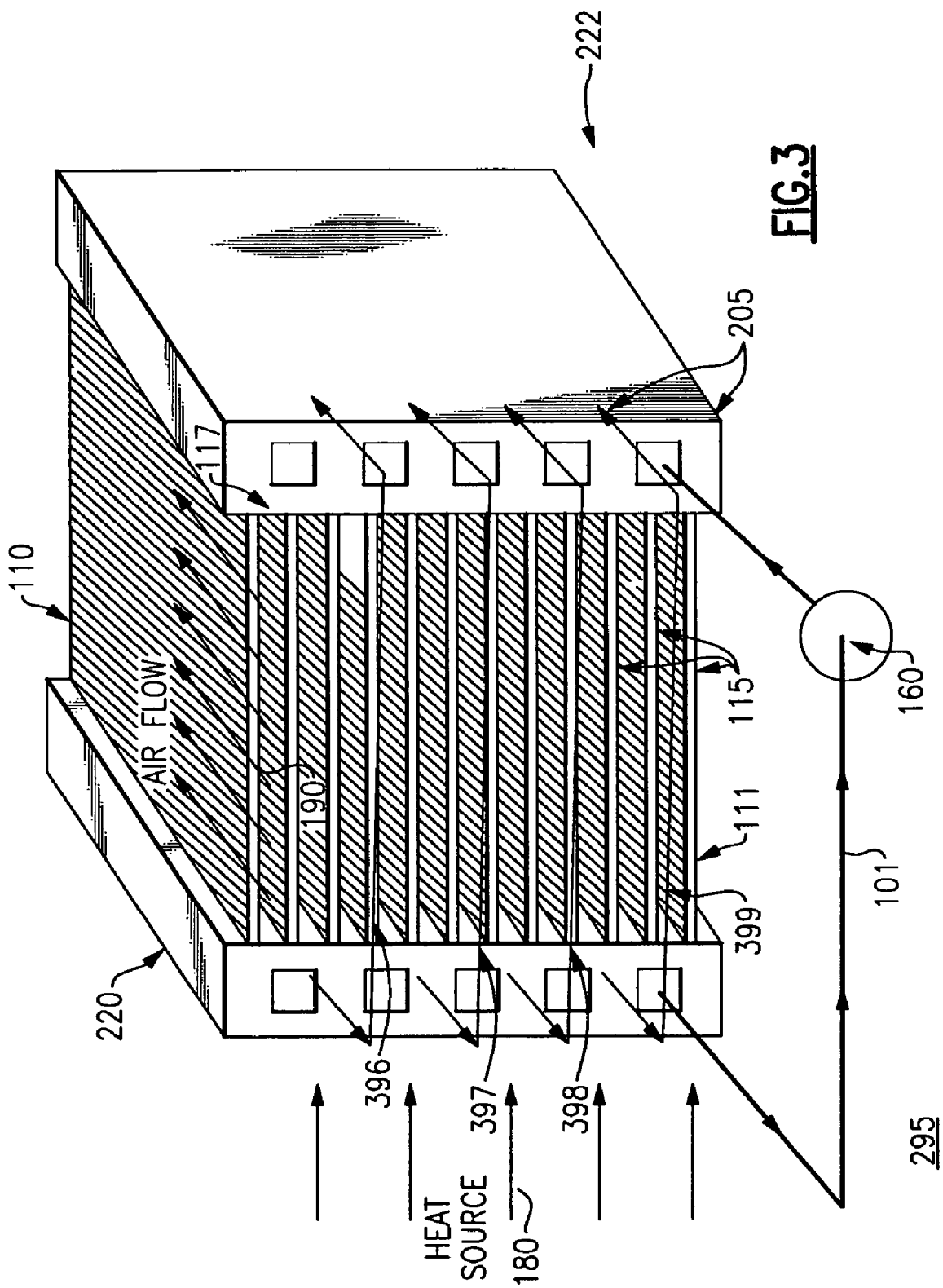
FIG. 3 is a cross sectional illustration of an alternate embodiment of present invention.

FIG. 2 and FIG. 3 are alternate embodiments providing for the apertured structure as discussed above. In FIG. 2, the loops 295 through 299 are all interconnected and intersect loop 295. The common intersection loop 245 then directs fluid flow to the pump 160. Again as way of example only one pump 160 is provided in the illustration with the understanding that additional pumps can be provided.

In FIG. 3, by contrast, each loop 295 and 396 through 399 are structured independently and can each be supplied by their own pump (not illustrated here), although this is not necessarily a requirement.

The placement of the apertures and thus the piping loops should also be discussed briefly. Referring back to FIG. 2 and 3, the apertures 205 are provided equidistantly and in a single column. This only indicates a preferred embodiment. Other embodiments are possible where the location of aperture placement is not equidistant and therefore the piping which is provided through them is not equidistantly positioned. This is regardless of whether the piping is positioned on parallel, substantially parallel or even intersecting planes. Similarly the apertures can be positioned such that their location match one another on different plates 220 and 222 or they can be positioned alternatively. It should be noted, however, that to provide substantially parallel fluid carrier loops it may be necessary to have matching apertures on different plates 220 and 222.

In all three embodiments as provided in FIGS. 1 through 3, it should also be noted that piping loops can be comprised of a single fabricated entity or a plurality of piping pieces secured to one another conventionally as known to those skilled in the art. In instances where a plurality of piping loops utilized, each individual piping loop needs to be secured to one another with special attention given to making it both water tight and fabricated and designed in a manner that does not comprise structural integrity of the heat sink. Providing support for the piping structure is of another concern especially in embodiments such as that provided in FIG. 3. For example additional housing can be provided and connected to different areas of the loop to provide structural support for the piping and the pump in such an example.

In addition, while the cross sectional depiction of the heat sink 100 with re-circulator 140 indicates an arrangement where the fins 145 are placed over one another horizontally with the fin structure 110 (and therefore heat sink 100) being stacked substantially vertically, it is possible to change the orientation of the heat sink 100 and the fin structure 110 as necessary. The only requirement in such a condition, however, where there is a desired change in orientation would be to place the fin structure 110 and the heat sink 100 in a manner as to allow the free flow of air if a hybrid or dual cooling function of air and liquid is desired. In such a condition, careful attention should also be paid to the placement of the assembly with respect to the heat source and direction of heat flow. The same can be true in connection with alternate embodiments suggested in FIGS. 2 and 3.

Figure 4:
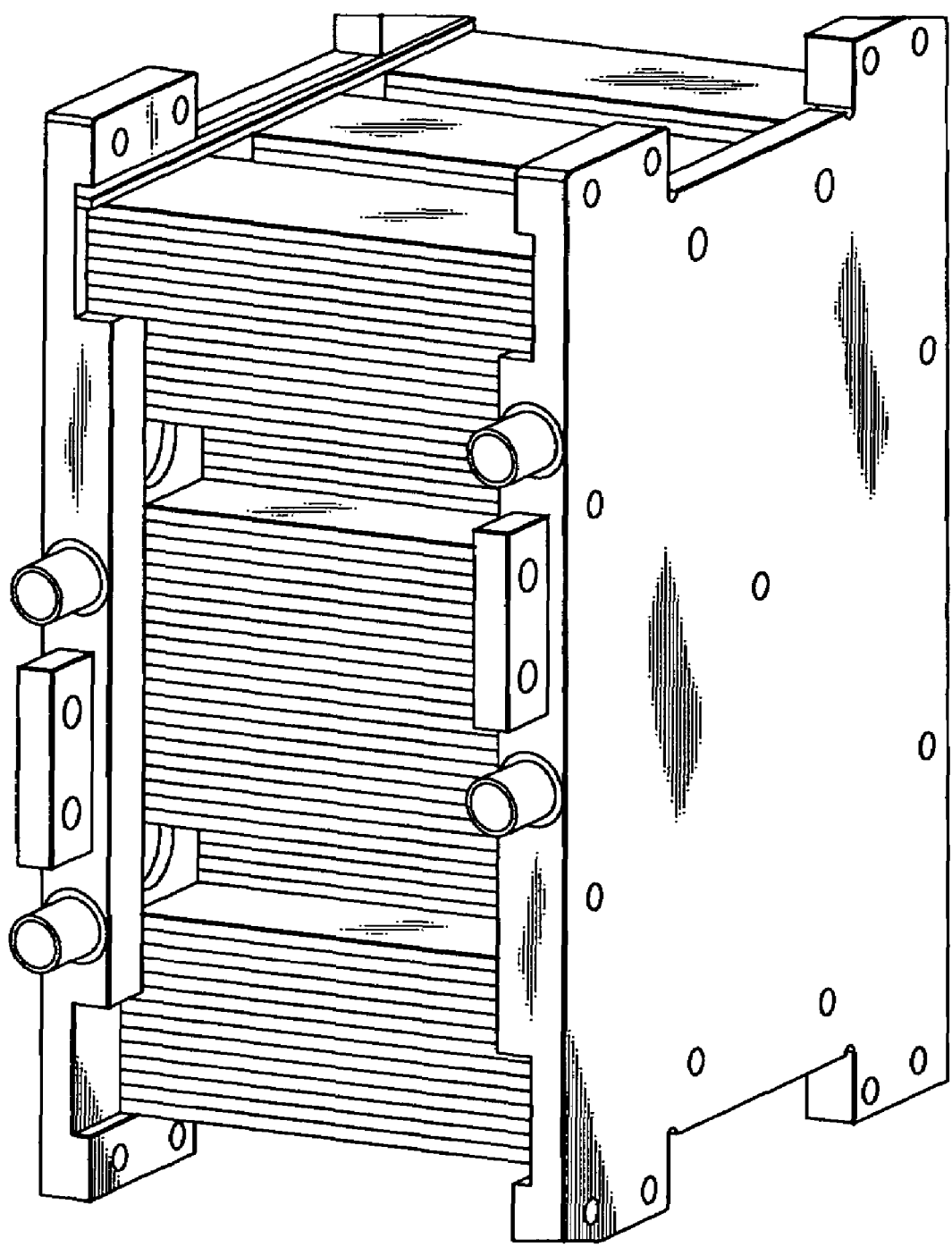
FIG. 4 provide a side view of the cooling assembly as discussed by the embodiments of the present invention.

FIG. 4 provide a side view of the cooling assembly as discussed by the different embodiments of the present invention. In FIG. 4, an arrangement is shown with the added inclusions of hoses and small pump(s).

The present invention, as discussed above provide for an improved cooling assembly that resolves the problems of prior art currently being practiced. The use of both air and liquid in cooling achieves maximum performance results that leads to an improved heat dissipation capability.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A liquid and air cooled heat sink disposed close to electronic components and used for cooling such components, comprising:
    a finned structure positioned such that air can easily pass though it;
    a heat source plate disposed thermally in direction of heat flow to one side of said finned structure such that said heat source plate is in thermal communication with said finned structure fin base and fin tips;
    a second cold plate disposed at an opposing end of said finned structure also in thermal communication both with finned structure fin base and fin tips such that said fin structure is disposed between said two plates;
    said first heat source and second cold plate being comprised of a thermally conductive material and each having a plurality of apertures; and
    a liquid re-circulator disposed at least partially in said plates and using said apertures for circulating fluids though said plates and around said finned structure such that both fin tips and fin base is cooled.

2. The heat sink of claim 1, wherein said re-circulator includes a fluid carrier partially embedded in said plates and at least a circulating fluid pump.

3. The heat sink of claim 2, wherein said plates are fabricated of metal or metal compounds.

4. The heat sink of claim 1, wherein said finned structure comprises a plurality of fins oriented substantially in parallel planes such that air can flow easily through and around each of them.

5. The heat sink of claim 4, wherein said fluid carriers comprise piping.

6. A liquid and air cooled heat sink disposed close to electronic components and used for cooling such components, comprising:

a finned structure positioned such that air can easily pass though it;

a heat source plate disposed thermally in direction of heat flow to one side of said finned structure such that said heat source plate is in thermal communication with said finned structure fin base and fin tips;

a second cold plate disposed at an opposing end of said finned structure also in thermal communication both with finned structure fin base and fin tips such that said fin structure is disposed between said two plates;

said first heat source and said second cold plate being comprised of a thermally conductive material and each having apertures for allowing flow of liquid into and out of said plates;

a liquid re-circulator partially disposed in said apertures for circulating fluids around said finned structure and said plates such that both fin tips and fin base is cooled.

7. The heat sink of claim 6, wherein said re-circulator further comprises a circulating fluid pump.

8. The heat sink of claim 7, wherein said re-circulator includes a plurality of fluid carriers, with each fluid carrier being disposed in said apertures such that each fluid carrier forms at least a partially closed loop.

9. The heat sink of claim 8, wherein said loops are interconnected at least at one point such that same fluid pump can circulate coolant inside them.

10. The heat sink of claim 8, wherein said apertures are provided in parallel planes and equidistantly from one another and said fluid carriers are disposed substantially equidistantly.

11. The heat sink of claim 8, wherein said fluid carriers comprise piping.

12. The heat sink of claim 7, wherein said re-circulator can connect to a plurality of pumps are provided.

13. The heat sink of claim 6, wherein said re-circulator can include a plurality of loops with different fluid carriers.

14. The heat sink of claim 6, wherein said apertures are provided in parallel planes and equidistantly from one another such that apertures in said heat source plate and said second plate match said others location for easy traversing of said loops.

15. The heat sink of claim 6, wherein said apertures are provided in parallel planes and equidistantly from one another and said fluid carriers are provided substantially on parallel planes.

16. The heat sink of claim 6, wherein said finned structure is fully embedded in said plates.

17. A method of cooling electronic units in a computing environment, comprising:

forming an air cooled and liquid cooled heat sink by orienting a finned structure having a plurality of similarly oriented stacked fins in a manner such that air flows easily through said fins;

establishing liquid cooling by disposing a heat source plate in direction of heat and at one side of said finned structure with a second cold plate being disposed on an opposing side of said finned structure such that said plates are in thermal communication with said finned structure fin base and fin tips and said fin stacks are embedded on said place on each side;

circulating coolant by a circulating pump through at least one fluid carrier embedded partially in said plates such that heat is convected at least partially to said coolant and circulated to fin tips and fin base to keep them in a substantially similar temperature; and said coolant being circulated thorough a plurality of apertures provided on said plates on each side of said fin stack.

* * * * *